United States Patent

Wang et al.

[11] Patent Number: 6,153,939
[45] Date of Patent: Nov. 28, 2000

[54] FLIP-CHIP SEMICONDUCTOR DEVICE WITH ENHANCED RELIABILITY AND MANUFACTURING EFFICIENCY, AND THE METHOD FOR UNDER FILLING THE SAME

[75] Inventors: Wei-Chung Wang; Hsueh-Te Wang, both of Kaohsiung Hsien; Jen-Kuang Fang, Pingtung Hsien; Su Tao, Kaohsiung, all of Taiwan

[73] Assignee: Advanced Semiconductor Engineering, Inc., Kaohsiung, Taiwan

[21] Appl. No.: 09/317,354

[22] Filed: May 24, 1999

[51] Int. Cl.[7] .......................... H01L 21/44; H01L 21/48; H01L 21/50
[52] U.S. Cl. .......................... 257/778; 257/734; 257/774
[58] Field of Search .............................. 438/26; 257/778, 257/774, 734

[56] References Cited

U.S. PATENT DOCUMENTS 5,767,575  6/1998  Lan et al. .
5,920,126  7/1999  Sohara .

Primary Examiner—Kevin M. Picardat
Assistant Examiner—D. M. Collins
Attorney, Agent, or Firm—William E. Pelton

[57] ABSTRACT

A flip-chip semiconductor device and a method for under filling the flip-chip semiconductor device are disclosed. The flip-chip semiconductor device is provided with a substrate and a die having a plurality of solder bumps for connecting to the substrate. Encapsulation material is under filled between the die and the substrate. The substrate has a non-mask area defied in a center portion thereof while the remaining surface area is covered by a solder mask. The non-mask area defines a hole in the center thereof so that the encapsulation material can be dispensed along all sides of the die to flow toward the non-mask area and stop when reaching the non-mask area whereby the encapsulation material does not block the hole and air between said die and the substrate is limited in a void formed around the hole and communicated with the atmosphere via the hole.

6 Claims, 5 Drawing Sheets

FLIP-CHIP SEMICONDUCTOR DEVICE WITH ENHANCED RELIABILITY AND MANUFACTURING EFFICIENCY, AND THE METHOD FOR UNDER FILLING THE SAME

BACKGROUND OF THE INVENTION

1. Field of the Invention

The present invention relates to the field of packaging flip-chip semiconductor device, and more particularly, to a flip-chip semiconductor device having a substrate covered with solder mask and a hole defined in the center of the substrate such that the process to under fill the semiconductor device is effective and the packaged semiconductor devices are reliable.

2. Description of Related Art

Flip-chip semiconductor devices are more and more popular because flip-chip technology permits a high component density and fast accessing time in a semiconductor system. FIG. 5 shows the structure of a conventional flip-chip semiconductor device, wherein a die (51) is attached to a substrate (53) in such a manner that the solder bumps (511) formed on the bottom face of the die (51) are combined with the solder pad (531) on the upper face of the substrate (53). One problem in such a flip-chip structure is that the coefficient of thermal expansion (CTE) of the die (51) is usually quite mismatched with that of the substrate (53). Therefore, the solder connection between the die (51) and the substrate (53) may be damaged when the operational temperature of the semiconductor device is too high and the die (51) and the substrate (53) expand in different degrees. To overcome such a thermal mismatch problem, encapsulation material (52) has to be filled into the space between the die (51) and the substrate (53) to encapsulate the solder bumps (511) thereby securely combining the die (51) and the substrate (53) together and decreasing the stress asserted on the solder connection between the die (51) and the substrate (53).

Further, to include the encapsulation material between the die (51) and the substrate (53), a dispensing needle (50) is used to dispense encapsulation material (52) along one side or two adjacent sides of the die (51) so that the encapsulation material (52) is then allowed to freely flow, as a result of capillary forces, beneath the die (51) and existing on the remaining sides. Such a dispensing process is time-consuming because encapsulation material (52) is dispensed along only one side or two sides of the die (51). Therefore, the manufacturing performance for the flip-chip semiconductor devices is difficult to increase. Moreover, it is likely to have voids generated in the encapsulation material (52) beneath the center portion of the die (51). Accordingly, when the packaged flip-chip semiconductor device is under SMD (Surface Mount Device) reflow, the air inside the voids is heated and expanded, causing the packaged semiconductor device to explode (known as popcorn phenomenon) or the die to crack. In addition, after the dispensing process, the fillet (55) formed on the dispensed side of the die (51) is larger than the fillet (56) formed on the side that is not dispensed. Therefore, it is not easy to better utilize space for the semiconductor device and the solder bumps (511) adjacent to the smaller fillet (55) are easier to be affected by thermal stress.

U.S. Pat. No. 5,710,071 granted to Beddingfielf et al. has provided an improved process for underfilling a flip-chip semiconductor device. With reference to FIG. 6, the process uses a substrate (63) with a hole (69) defined in the center thereof so that encapsulation material (62) can be dispensed along four sides of the die (61) at the same time and the air between the die (61) and the substrate (63) can escape through the hole (69) to avoid generating voids. Such a process is able to reduce the time required for underfilling because encapsulation material (62) is dispensed along all sides of the die (61). However, if the die (61) is not of square shape or the solder bumps (611) are not arranged in a symmetric form, as shown in FIG. 7, the encapsulation material (62) dispensed from four sides will flow asymmetrically due to the block of the solder bumps (611). That is, the encapsulation material (62) has a fast flow speed (V1) when it flows through an area with small amount of solder bumps (611). On the contrary, the encapsulation material (62) has a slow flow speed (V2) when it flows through an area with large amount of solder bumps (611). Therefore, the encapsulation material (62) with fast flow speed (V1) may reach and block the hole (69) while the encapsulation material (62) with slow flow speed (V2) is still flowing toward the hole (69). As a result, air is trapped between the die (61) and the substrate (63), and the dispensing process is not effective. Accordingly, there is a desired to have a process for under filling a flip-chip semiconductor device, which can eliminates the aforementioned problems.

SUMMARY OF THE INVENTION

One objective of the present invention is to provide a reliable flip-chip semiconductor device which is convenient and effective for underfilling encapsulation material.

Another objective of the present invention is to provide a effective method for underfilling the flip-chip semiconductor device.

In accordance with one aspect of the present invention, a flip-chip semiconductor device is provided with a substrate and a die having a plurality of solder bumps for connecting to the substrate. Encapsulation material is under filled between the die and the substrate. The substrate has a non-mask area defined in a center portion thereof while the remaining surface area is covered by a solder mask. The non-mask area defines a hole in the center thereof so that the encapsulation material can be dispensed along all sides of the die to flow toward the non-mask area and stop when reaching the non-mask area whereby the encapsulation material does not block the hole and air between said die and the substrate is limited in a void formed around the hole and communicated with the atmosphere via the hole.

In accordance with another aspect of the present invention, a method for underfilling a flip-chip semiconductor is provided to first provide a substrate having a non-mask area defined in a center portion thereof while the remaining surface area is covered by a solder mask. The non-mask area defines a hole in the center thereof. Secondly, a die having a plurality of solder bumps is attached to the substrate, and the hole of the substrate is substantially aligned with the center of the die. Finally, encapsulation material is dispensed along all sides of the die at the same time, wherein the encapsulation material flows toward the non-mask area and stops flowing when reaching said non-mask area without blocking the hole thereby effectively expelling air between the die and the substrate via the hole and limiting residual air around the hole to form a void.

Other objectives, advantages, and novel features of the invention will become more apparent from the following detailed description when taken in conjunction with the accompanying drawings.

DETAILED DESCRIPTION OF THE PREFERRED EMBODIMENT

Figure 1:
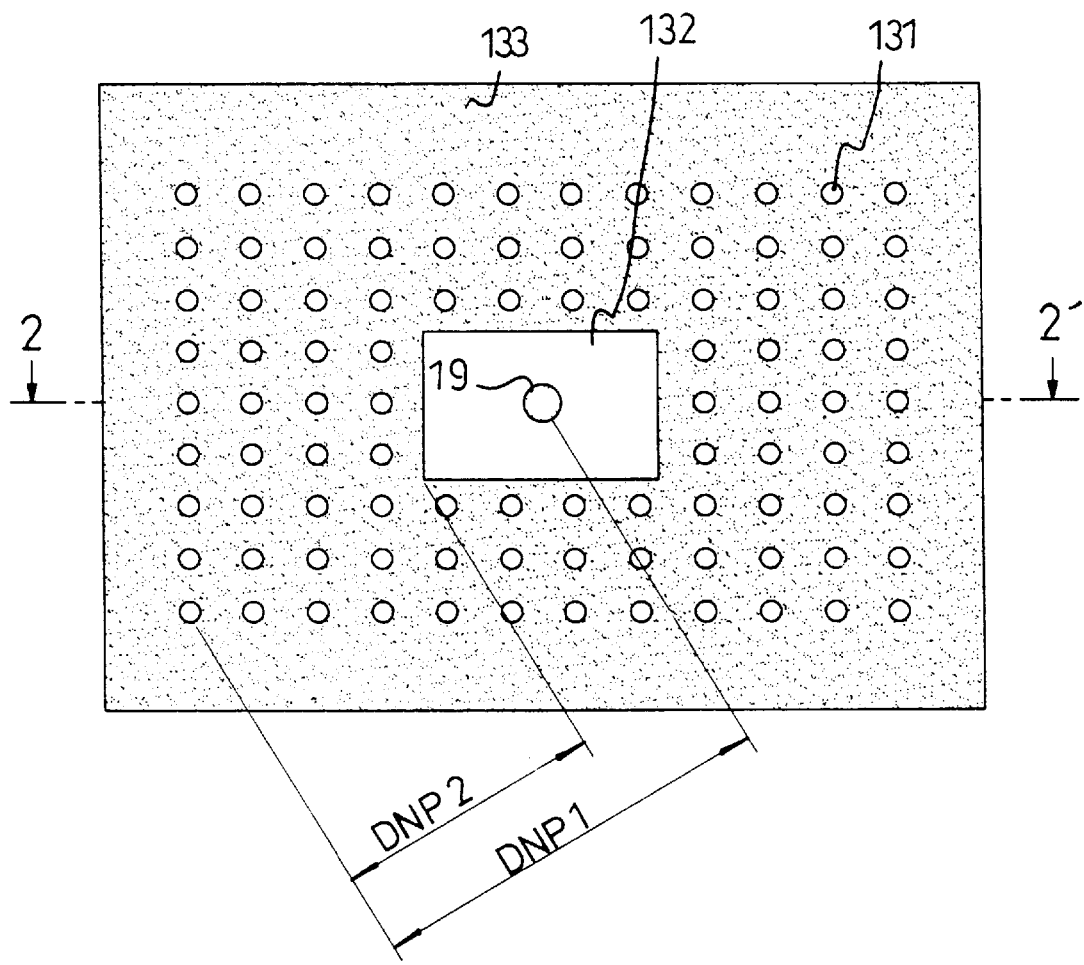
FIG. 1 is a top plain view of a substrate used by the method for under filling a flip-chip semiconductor device in accordance with the present invention.
Figure 2:
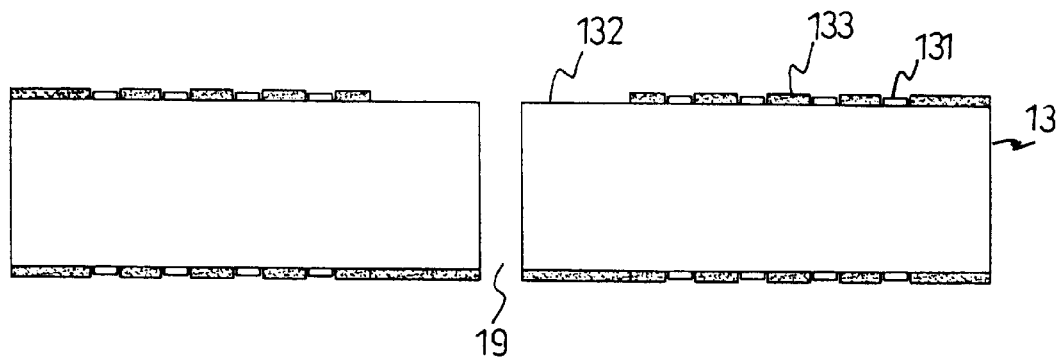
FIG. 2 is a cross sectional view along line 2-2' of the substrate shown in FIG. 1.

FIG. 1 and FIG. 2 are the plain view of a substrate (13) and a cross sectional view along AA' line of the substrate (13) that is used by the method for underfilling a flip-chip semiconductor device in accordance with the present invention. The substrate (13) has a non-mask area (132) defined in a center portion thereof, while the remaining area is covered by a solder mask (133). The non-mask area (132) is substantially of rectangular shape. A hole (19) is defined in the center of the non-mask area (132). The substrate (13) has a plurality of solder pads (131) formed on the mask area. The plurality of solder pads (131) are not covered by the solder mask (133) and provided for soldering with a die (not shown).

Figure 3:
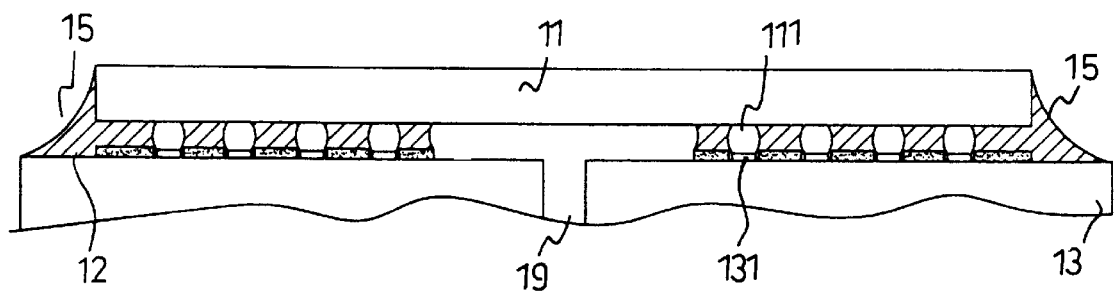
FIG. 3 is a side cross sectional view of a flip-chip semiconductor device in accordance with the present invention.
Figure 4:
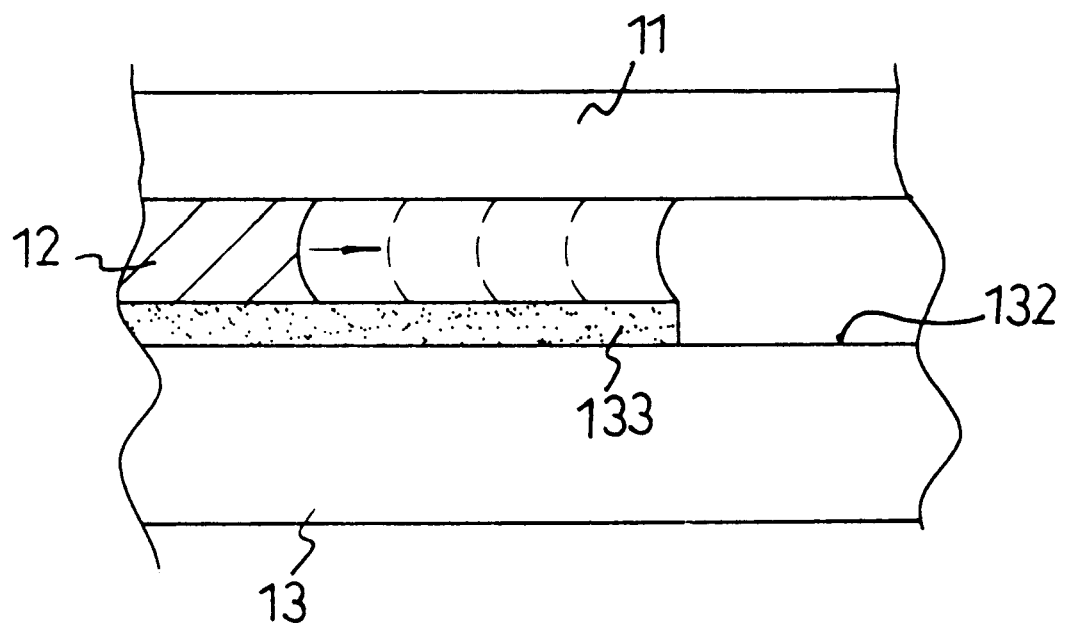
FIG. 4 is a schematic diagram showing the flow of the dispensed encapsulation material.
Figure 5:
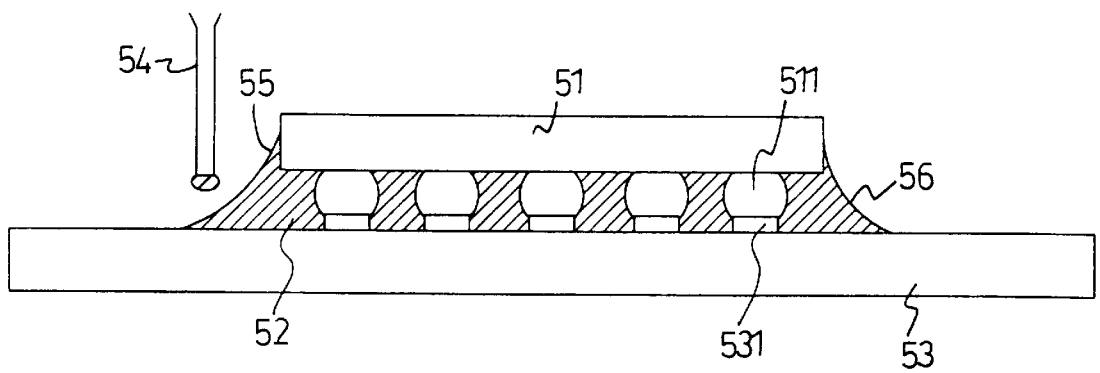
FIG. 5 is a schematic diagram showing the structure of a conventional flip-chip semiconductor device and the dispensing of encapsulation material.
Figure 6:
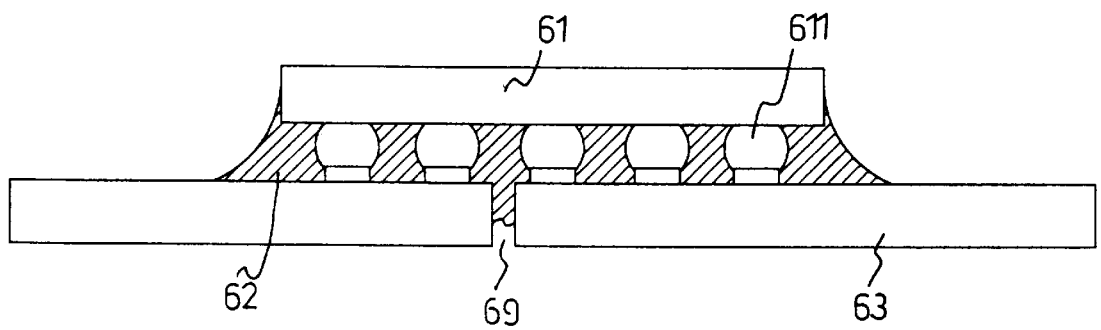
FIG. 6 is a side cross sectional view of another conventional flip-chip semiconductor device.
Figure 7:
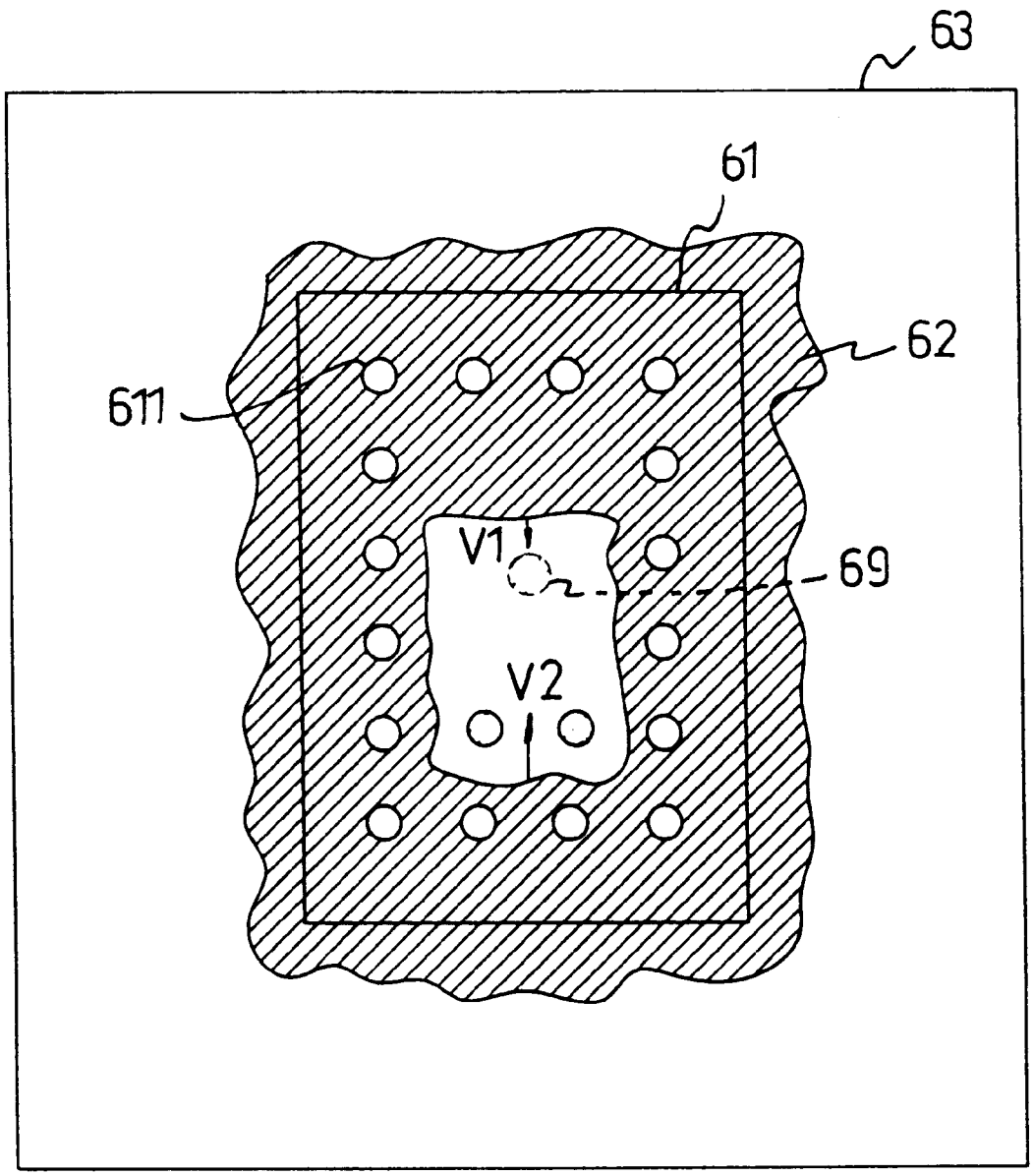
FIG. 7 is a schematic diagram showing the flow of encapsulation material in a conventional underfill process.

With reference to FIG. 3, a die (11) is mounted to the substrate (13) by soldering a plurality of solder bumps (111) on the die (11) to the plurality of solder pads (131) on the substrate (13), respectively. The hole (19) of substrate (13) is approximately aligned with the center of the die (11). When encapsulation material is dispensed along all sides of the die (11), as shown in FIG. 4, the encapsulation material (12) flows inwardly between the bottom face of the die (11) and the solder mask (133) of the substrate (13) due to the capillary phenomenon. The flow of the encapsulation material (12) stops when it reaches the non-mask area (132). That is, the encapsulation material (12) only flows from the peripheral of the die (11) to the edge of the non-mask area (132). Therefore, the encapsulation material (12) is limited to under fill the portion of a flip-chip semiconductor device that has solder joints so that the DNP (distance from neutral point) of the solder joints can be decreased. With reference to FIG. 1 again, if the encapsulation material (12) fully covers the substrate (13), the solder pad (131) on the comer of the substrate (13) is know to have the largest distance from neural point which is indicated to be DNP 1. However, if the encapsulation material (12) only covers the solder mask (133) of the substrate (13) as employed by the flip-chip semiconductor device in accordance with the present invention, the distance from neural point of the solder pad (131) on the comer is only DNP2. Therefore, the distance from neural point (DNP) can be effectively decreased. Because the thermal stress, caused by the mismatch in thermal expansion between the die (11) and the substrate (13), asserted on the solder joints is related to the value of the DNP, the decrease in DNP can effectively enhance the reliability of the flip-chip semiconductor device.

Furthermore, because there is a hole (19) defined in the center of the substrate (13), the air trapped between the die (11) and the substrate (13), when encapsulation material (12) is dispensed along all sides of the die (11), can be expelled via the hole (19). Moreover, the encapsulation material (12) is restricted to flowing to the non-mask area (132). Therefore, even though the die (11) does not have a square shape or the solder bumps (111) of the die (11) is not distributed symmetrically, which results in that the flow of the encapsulation (12) is not uniform, the hole (19) will not be blocked by the encapsulation material (12) which flows faster so that trapped air can be effectively expelled and the known popcorn problem can be eliminated. Accordingly, the underfill process is convenient and effective, and all of the fillets (15) of the flip-chip semiconductor device are substantially the same.

Although the present invention has been explained in relation to its preferred embodiment, it is to be understood that many other possible modifications and variations can be made without departing from the spirit and scope of the invention as hereinafter claimed.

What is claimed is:

1. A flip-chip semiconductor device comprising:

a substrate having a non-mask area defined in a center portion thereof and a masked area, said non-mask area defining an unobstructed air evacuation passageway in a center thereof, a plurality of solder pads being disposed in the masked area;

a die having a plurality of solder bumps for connection to said solder pads of said substrate; and encapsulation material between said die and said substrate, wherein said encapsulation material is dispensed along all sides of said die to flow toward said non-mask area and stop when reaching said non-mask area whereby said encapsulation material will not block said passageway and air between said die and said substrate is evacuated via said passageway.

2. The flip-chip semiconductor device as claimed in claim 1, wherein the void is defined between the substrate and the die when the encapsulation material reaches the non-mask area.

3. The flip-chip semiconductor device as claimed in claim 1, wherein the solder pads are not disposed symmetrically on the substrate.

4. A substrate for use in a flip-chip semiconductor device, the substrate comprising:

a non-mask area formed in the center thereof;

a solder mask formed around the non-mask area; and an unobstructed air evacuation passageway defined in the center of the non-mask area.

5. The substrate as claimed in claim 4 further comprising multiple solder pads disposed on the solder mask.

6. The substrate as claimed in claim 5, where the solder pads are not disposed symmetrically.

* * * * *